United States Patent
Wang (10) Patent No.: US 6,750,686 B2
(45) Date of Patent: Jun. 15, 2004

(54) FREQUENCY DIVIDER WITH REDUCED POWER CONSUMPTION, APPARATUS BASED THEREON, AND METHOD FOR POWER EFFICIENT FREQUENCY DIVIDER

(75) Inventor: Zhenhua Wang, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/204,391

(22) PCT Filed: Dec. 18, 2001

(86) PCT No.: PCT/IB01/02650
§ 371 (c)(1),
(2), (4) Date: Aug. 20, 2002

(87) PCT Pub. No.: WO02/052727
PCT Pub. Date: Jul. 4, 2002

(65) Prior Publication Data
US 2003/0030471 A1 Feb. 13, 2003

(30) Foreign Application Priority Data

Dec. 22, 2000 (EP) .............................................. 00128322

(51) Int. Cl.[7] .............................................. H03K 21/00
(52) U.S. Cl. .......................... 327/115; 327/117; 377/47
(58) Field of Search ................................ 327/115, 117; 377/48–52, 47; 331/1 A, 16, 25

(56) References Cited

U.S. PATENT DOCUMENTS

| | | | | |
|---|---|---|---|---|
| 4,184,068 A | * | 1/1980 | Washburn | 377/44 |
| 4,264,863 A | * | 4/1981 | Kojima | 377/110 |
| 5,065,415 A | * | 11/1991 | Yamashita | 377/52 |
| 5,581,214 A | | 12/1996 | Iga | 331/16 |
| 6,066,990 A | * | 5/2000 | Genest | 331/25 |
| 6,281,721 B1 | * | 8/2001 | Kinget et al. | 327/115 |
| 6,593,782 B2 | * | 7/2003 | Pierschel et al. | 327/115 |

* cited by examiner

Primary Examiner—Minh Nguyen
(74) Attorney, Agent, or Firm—Aaron Waxler (57) ABSTRACT

Apparatus including a frequency dividing cell (42) with a prescaler logic, an end-of-cycle logic, a clock input for receiving an input clock (CKin) with frequency fn, a clock output for providing an output clock (CKout) with frequency fm to a subsequent cell (43), a mode control input for receiving a mode control input signal (MDin) from the subsequent cell (43), and a mode control output for providing a mode control output signal (MDout) to a preceding cell (41). The end-of-cycle logic of the frequency dividing cell (42) has a switchable tail current source. This switchable tail current source allows the biasing current of the end-of-cycle logic to be switched off in to save power.

26 Claims, 9 Drawing Sheets

FREQUENCY DIVIDER WITH REDUCED POWER CONSUMPTION, APPARATUS BASED THEREON, AND METHOD FOR POWER EFFICIENT FREQUENCY DIVIDER

The present invention concerns frequency dividers, apparatus, and methods for frequency division. More particularly, this invention relates to a frequency divider architecture, circuit technique and method based on the zipper divider architecture.

Great efforts have been made in radio frequency (RF) design towards one-chip transceivers in standard complementary metal oxide semiconductor (CMOS) in recent years. Particularly the CMOS implementation of frequency dividers and frequency synthesizers—one of key building blocks in a transceiver—have attracted a lot of attention. The most notable trend here is the zipper divider architecture and the so called current-mode logic (CML).

The known zipper divider is comprised of a chain of divide-by-2/3 cells of identical circuitry.

Figure 1:
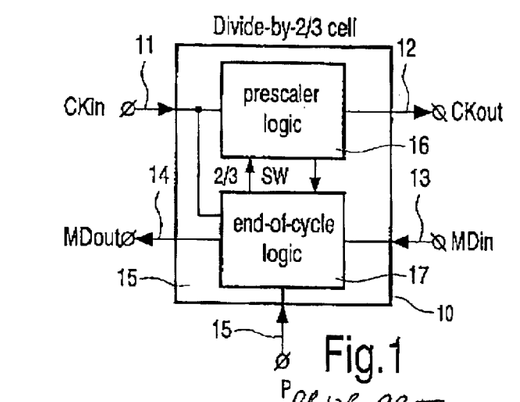
FIG. 1 is a conventional divide by 2/3 cell comprising two logic blocks.

Shown in FIG. 1 is a conventional divide-by-2/3 cell 10 having five terminals 11–15: clock input (CKin) 11, divided clock output (CKout) 12, mode control input (MDin) 13, mode control output (MDout) 14, and a programming input (P) 15. Each divide-by-2/3 cell 10 consists of two circuit blocks: a prescaler logic block 16 which divides either by 2 or 3, controlled by a swallow signal (SW) generated by another block called end-of-cycle logic 17.

When a programming bit P=0 (with MDin=1 or MDin=0) is applied at the programming input 15, then the cell 10 divides by 2 and when P=1 and MDin=1 it divides by 3.

The divide-by-2/3 cells are typically implemented in CML. An elementary CML logic circuit comprises several stacked differential pairs, two resistive or active loads, and one tail current source. Depending on the input logic states, the tail current is so rerouted inside the CML logic circuit that the voltage drop over the two loads represent exactly the desired logic function. In such a circuit operation, the metal oxide semiconductor (MOS) transistors in each differential pair act simply as switches. The current consumption of the CML logic circuit is determined by the tail current, independent of the input frequency, and not affected whether an input signal is present or not.

Figure 2A:
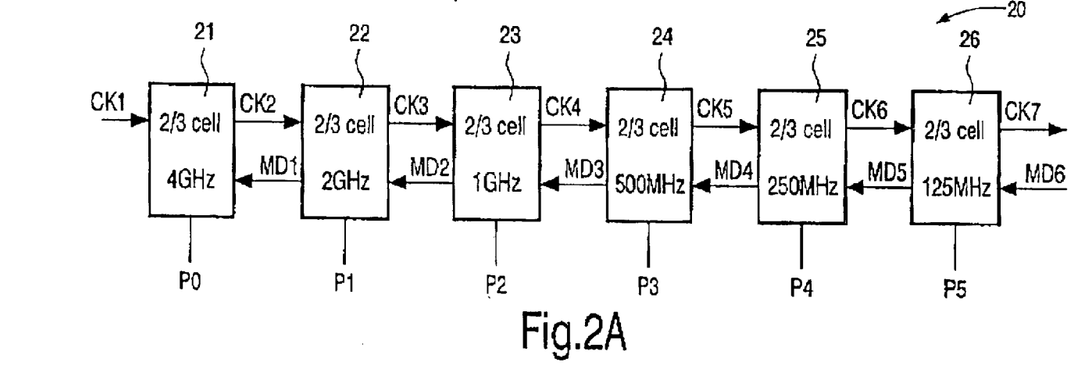
FIG. 2A is a conventional zipper divider architecture comprising six divide by 2/3 cells.
Figure 2B:
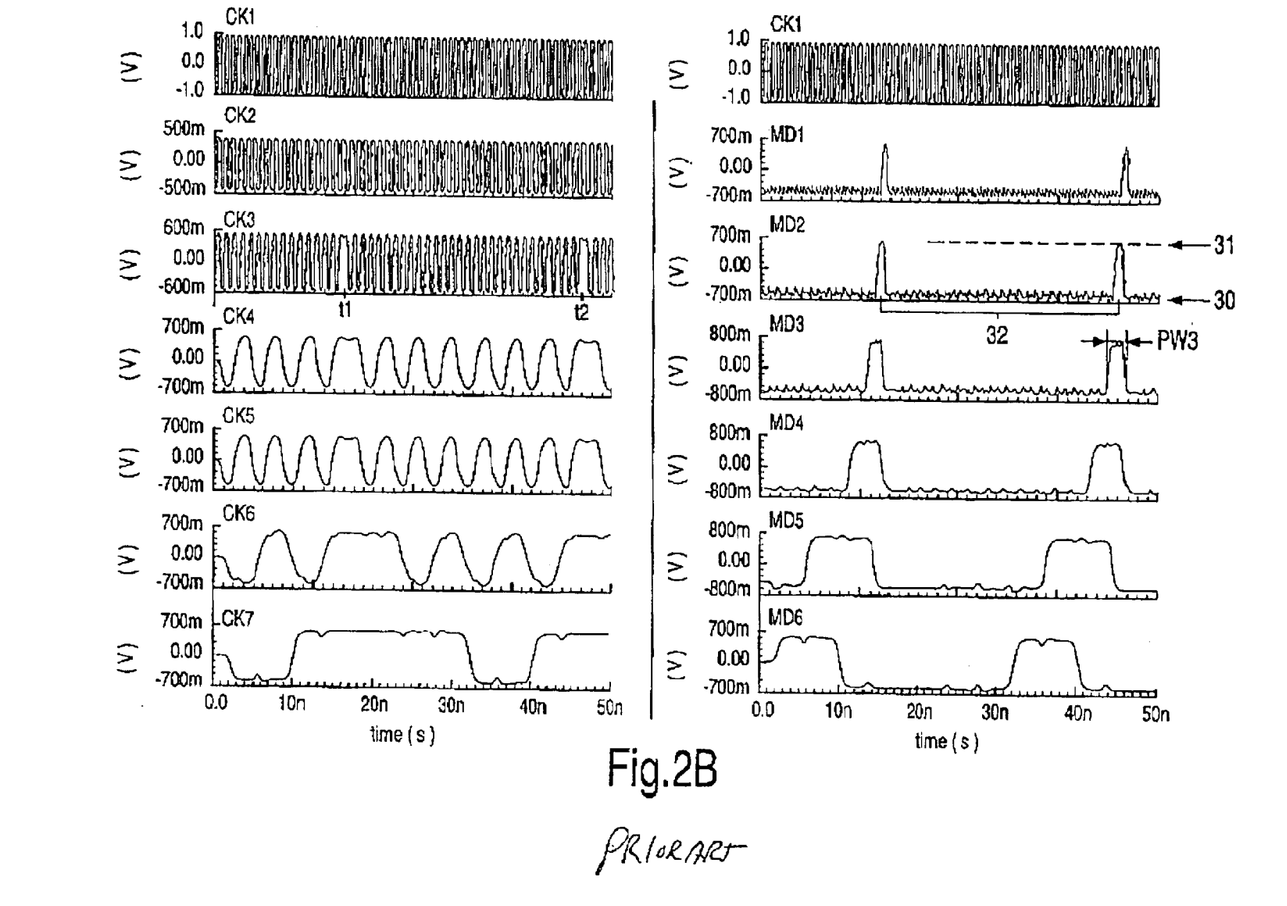
FIG. 2B is a diagram depicting the clock signals and mode control signals of the conventional zipper divider architecture of FIG. 2A.

An example of a known frequency divider 20 comprising a chain of six divide-by-2/3 cells 21–26 is depicted in FIG. 2A. The divider 20 is capable of operating at an input clock frequency (CK1) in the GHz range. FIG. 2B shows the terminal signals of the frequency divider 20. The clock input and clock output signals are depicted in the plots on the left hand side of FIG. 2B and the mode control signals are depicted on the right hand side. The amplitudes of the clock input and clock output signals range in the present example between −500 mV and +500 mV (peak-to-peak) since the divider 20 is realized in CML. In the present example, for most of the time, the cells 21–26 divide their clock input by 2. If the division ratio is 3, the pulse width is wider, as visible on the left hand side of FIG. 2B. In case of the signal CK3, for example, at the times t1 and t2 the division ratio is 3. This is due to the fact that a binary word P=111111 is applied to the programming input. If the programming inputs are always logic "1" the division ratio of the individual cells 21–26 is only determined by the mode control signal (MD) issued by a subsequent cell to a preceding cell.

As illustrated on the right hand side, these mode control signals (MD) are usually in a state 30 representing a logical "0" Only for a short period of time the mode control signals take on a state 31 representing a logical "1". This is particularly true for the first few cells of a chain of cells.

Another frequency divider is described in the U.S. Pat. No. 5,581,214. This frequency divider, which is based on the traditional frequency divider architecture being different from the zipper divider architecture, can be switched off when not needed. Turning the frequency divider on and off limits its application strictly to time-division applications or the like. No power saving is being achieved if the frequency divider proposed in this US Patent is kept on. When the frequency divider circuit is alternately turned off, the power consumption is reduced but the divider ceases from working at the same time. The frequency divider is further characterized in that the complete prescaler logic is switched between on and off. The frequency divider is controlled by an external on/off signal. Estimates reveal that with the frequency divider proposed in the US Patent only a few percents of power can be saved.

Many systems and devices—such as mobile phones, personal digital assistants, palm tops, and so forth—have very limited power resources due to the fact that they rely on batteries.

Working at GHz frequency range and above, a frequency divider consumes unavoidably quite a lot of power, typically several mA. Power consumption of the frequency dividers is therefore an important performance parameter if one wants to employ them in systems and devices with limited resources.

It is therefore an object of the present invention to provide a frequency divider with much reduced power consumption and improved power efficiency.

A novel frequency divider architecture as well as a novel circuit technique and method are presented herein which allow to save power. The novel architecture and technique is based on the known zipper divider architecture in combination with current mode logic (CML).

The frequency divider architecture provided herein allows a power reduction of up to 50%, or even above. A preferable implementation of the inventive concept ensures correct logic operation all the time, i.e., no matter whether the tail currents are turned on or off.

According to the present invention only some of the subcircuits of the frequency divider are switched between on and off.

According to the invention proposed herein, the on-time is a fraction of one reference cycle.

The period of the on/off is fixed and is equal to that of the output frequency of the frequency divider.

According to the present invention, the on/off signal is generated by the frequency divider itself.

It is an advantage of the present invention that the frequency dividers remain operational irrespective of whether they are in an on-mode or an off-mode.

According to the present invention up to 50% power savings—and even more than 50%—can be achieved. The power efficiency is thus remarkably improved.

For a more complete description of the present invention and for further objects and advantages thereof, reference is made to the following description, taken in conjunction with the accompanying drawings, in which.

For sake of simplicity, the signal lines in the various Figures are shown as single ended signal lines. In reality, all signals are differential, meaning that there are in fact two signal lines.

As indicated in FIG. 2B, the output of the prescaler block 16 changes its logic states much more often than the end-of-cycle logic 17 does, which changes only once within one output cycle 32. During most of time within one output cycle 32 the mode control signal (MD) remains logic 0 and only changes to logic 1 at the end of each cycle for a small fraction of time.

The prescaler block 16 and the end-of-cycle logic block 17 in each cell contain latches realized in CML. These latches are triggered by the same input clock (CKin) of that cell 10 and therefore, have the same switching activity.

This observation has led to the basic idea of this invention, namely to replace the constant tail currents in the end-of-cycle logic 17 by a switchable current in a way that those tail currents are turned off for most of the time in an output cycle 32 and turned on only when they are needed to generate the mode control signal (pulse) for the preceding cell and the swallow signal (SW) to the prescaler logic block 16 in the same cell. For correct operation the states of these signals have to be maintained when the tail currents are switched off. By doing so the current consumption of the end-of-cycle block 17 can be reduced almost to zero, for large division ratios.

As the input frequency after each cell is reduced by a factor of at least 2 (depending on the state at the programming input 15 and the mode control input 13) along the chain, the tail current is roughly scaled down typically by the same factor cell by cell along the chain as well. This means that the greatest power saving potential lies at the far front cells (i.e., the cells to the left in FIG. 2A) where the tail currents are the highest.

The improved frequency divider architecture 40 proposed herein is described with a design example containing also a total of six frequency dividing cells 41–46 for comparison reasons. As detailed in FIG. 3, this new frequency divider 40 comprises a control block 47, a switching biasing block 48, three modified divide-by-2/3 cells 41, 42, and 43 in the front-end and three conventional divide-by-2/3 cells 44, 45, and 46 (as in FIG. 2A) in the backend. The modified cells 41, 42, and 43 allow the biasing current of the end-of-cycle logic to be switched off while it is ensured that the correct logic states are maintained.

Figure 3:
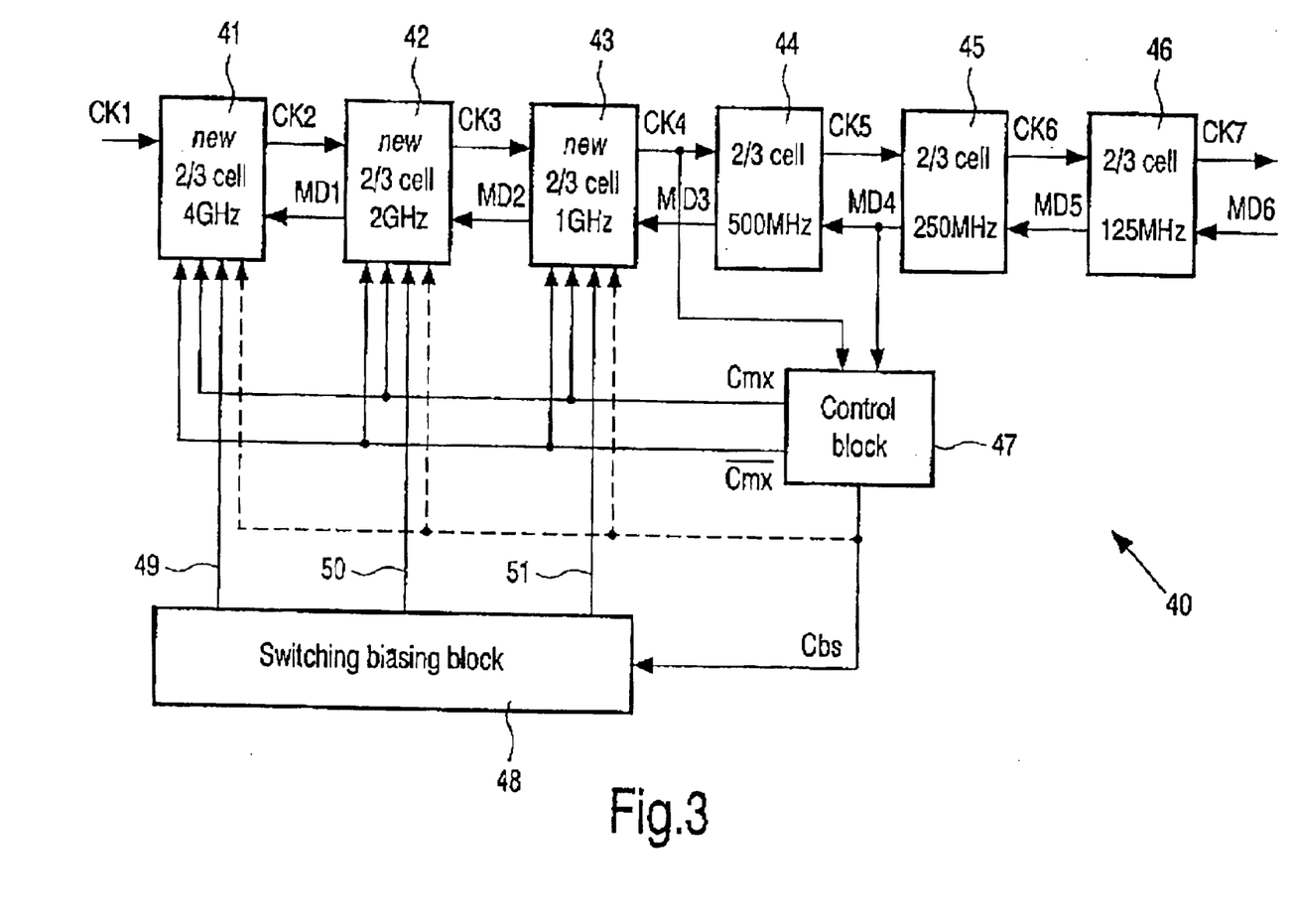
FIG. 3 is a schematic representation of an apparatus, in accordance with the present invention.

In FIG. 3 three signals are derived from CK4 and MD4 and fed to the control block 47 to control the operation of the first three cells 41, 42, and 43. In the present example, the first frequency dividing cell 41 receives a clock input (CK1) of 4 GHz, the second frequency dividing cell 42 receives a clock input (CK2) of roughly 2 GHz, and the third frequency dividing cell 43 receives a clock input (CK3) of roughly 1 GHz. Of course these signals can also be generated with other terminal signals (after 250 MHz cell) or a combination of many terminal signals. Generally, it is preferred not to take terminal signals from the cells too close to the last cell 46 in order to achieve the maximum possible power reduction. This will become clearer farther below. The control block 47 in the present implementation example generates three control signals designated as Cbs, Cmx and $\overline{\text{Cmx}}$. Cbs is dedicated to control the current biasing to the end-of-cycle blocks in the first three frequency dividing cells 41, 42, and 43. Note that these three signals are rail-to-rail signals, which have amplitudes between 0V and the value of the supply voltage VDD. When Cbs is 'low' (i.e., close to 0V), the biasing currents to the end-of-cycle block in each of the first three cells 41–43 are turned off while the biasing currents are on when Cbs is 'high' (i.e., close to VDD). So during period when Cbs=1 the new circuit 40 of FIG. 3 behaves exactly the same as the conventional circuit 20 of FIG. 2A.

The end-of-cycle block in each of the first three cells 41–43 is so constituted that the new frequency divider 40 of FIG. 3 behaves the same as that of FIG. 2A, too, though the tail currents are turned off. $\overline{\text{Cmx}}$ is the inverted signal of Cmx.

Figure 4A:
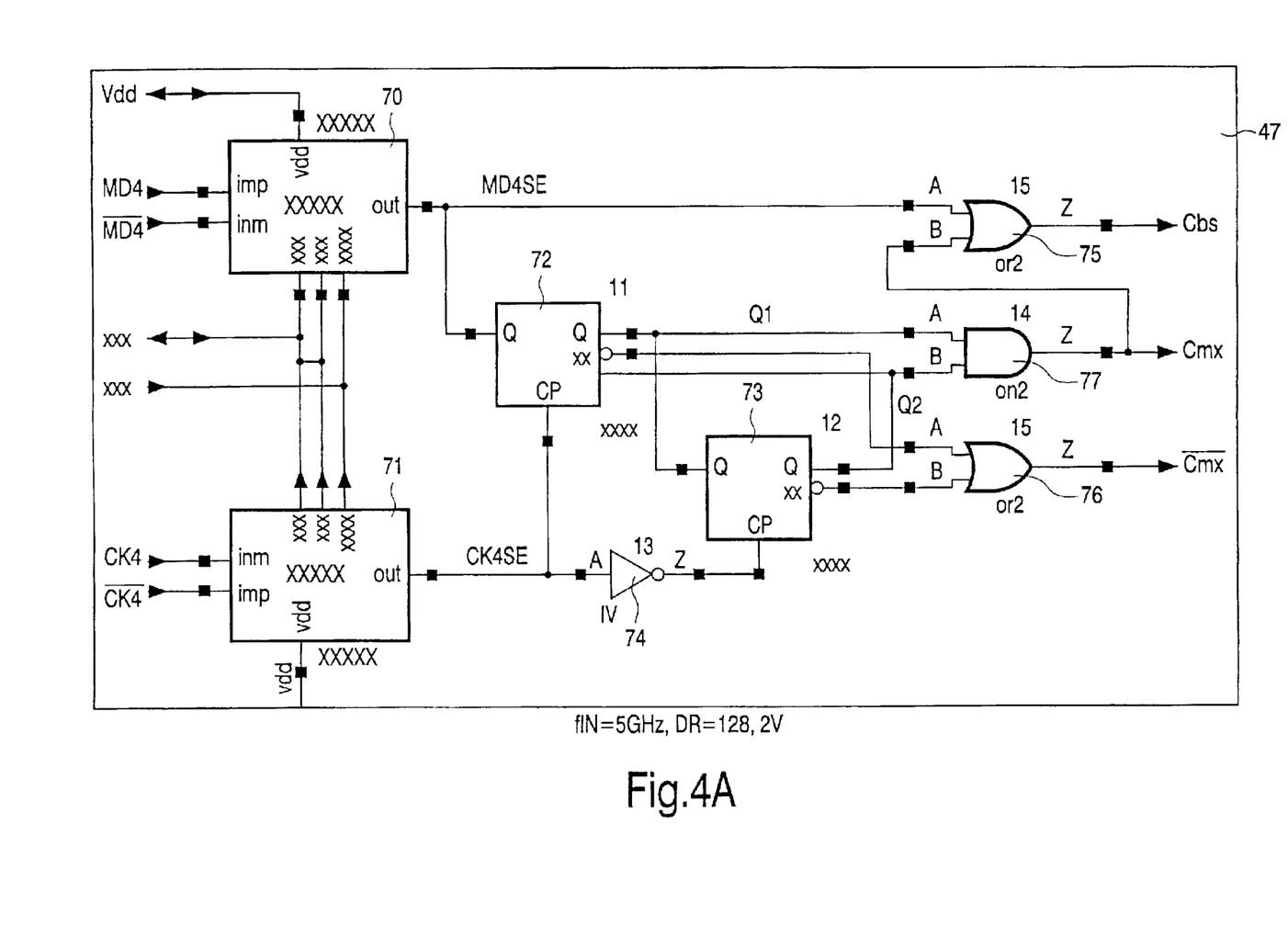
FIG. 4A is a schematic representation of a building block of the apparatus of FIG. 3, in accordance with the present invention.
Figure 4B:
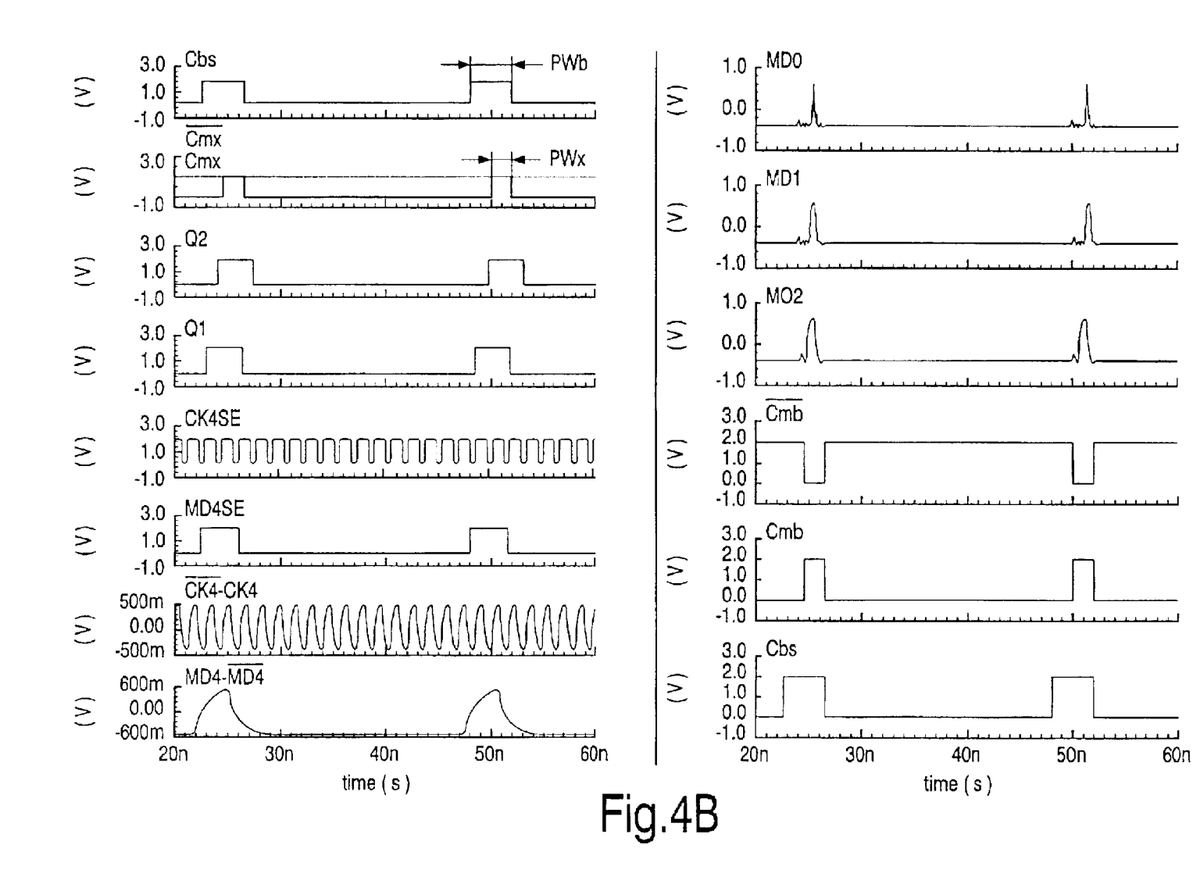
FIG. 4B is a diagram depicting the waveforms of various signals.

A very robust control circuit 47 among many possible circuit schemes, which keep the overhead in terms of power and area to a minimum, is shown in FIG. 4A. The control signals for controlling the frequency dividing cells 41–43 are derived from the differential mode control signals MD4, $\overline{\text{MD4}}$, and the clock signals CK4, $\overline{\text{CK4}}$, via two CML-to-2R (rail-to-rail) converters 70, 71 (also referred to as differential-to-single-ended converters) followed by a conventional logic part. This conventional logic part in the present implementation example comprises two D-Flip-Flops (DFFs) 72, 73, an inverter 74, two OR-gates 75, 76 and one AND-gate 77, as depicted in FIG. 4A. The operation principle is straightforward with the waveforms shown on the left of FIG. 4B. Also on the right hand side of FIG. 4B are the signals MD0–MD2 well situated in the middle of the Cmx pulse width. Also the swallow signals SW1–SW3 (not shown in the FIG. 4B) are well covered by Cmx and $\overline{\text{Cmx}}$.

The current biasing of a CML circuit is normally realized with current mirrors, where the input biasing current generates a biasing voltage through a diode-connected MOS transistor.

By connecting the gate of another transistor of the same type to the common gate and drain node of the input transistor, an accurate biasing current can be generated by choosing a proper aspect ratio of the two transistors. In some reported dividers a current mirror is placed in each frequency dividing cell, so an input biasing current is asked for in each such cell. In other dividers a multi-output current mirror is used where only one input biasing current is required for the entire frequency divider, thus yielding a higher power efficiency.

Whether the signal Cbs, as generated by the control circuit 47 has to applied to each frequency dividing cell or not obviously depends on the actual biasing scheme.

FIG. 3 shows a common biasing scheme. Here the switching biasing block 48 contains a multi-output current mirror (three outputs 49, 50, 51 in the present implementation) to deliver the tail currents for the end-of-cycle blocks of the first three frequency dividing cells 41–43, respectively. Note that for simplicity the biasing for the prescaler logic blocks of the first three frequency dividing cells 41–43 as well as for the other three cells 44–46 are not shown in FIG. 3.

If the biasing is done locally within each frequency dividing cell, the switching biasing has to be implemented within each cell. Then the signal Cbs is applied directly to each frequency dividing cell, as indicated by the dashed lines in FIG. 3.

Figure 5A:
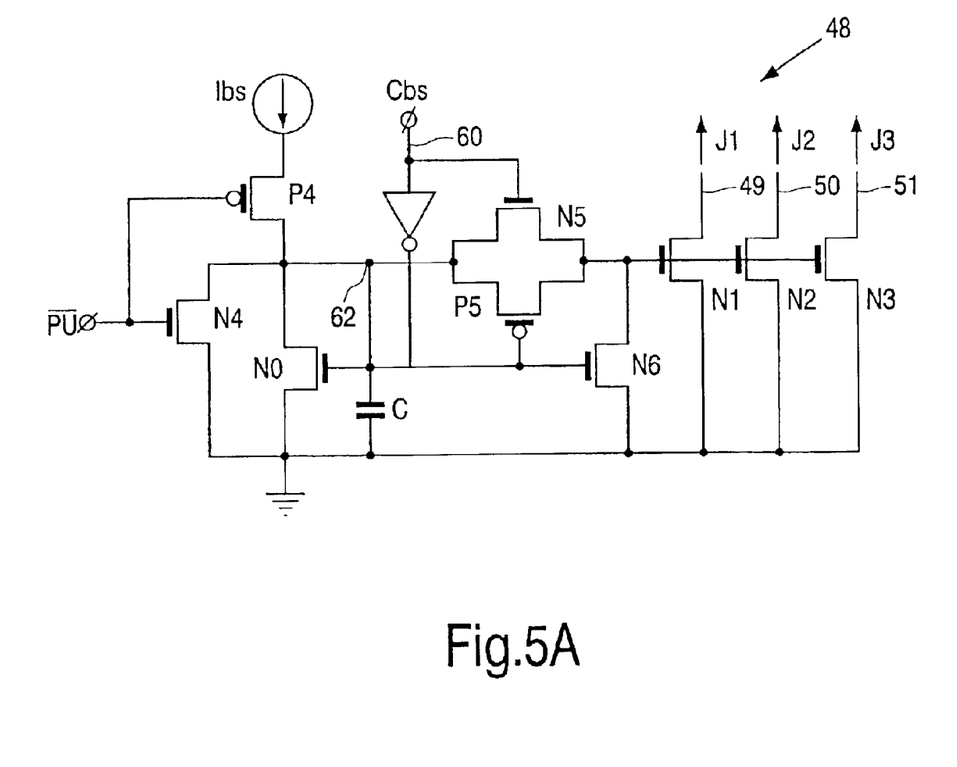
FIG. 5A is a schematic representation of a building block used to bias certain frequency dividing cells of the apparatus in FIG. 3, in accordance with the present invention.

An implementation example of a switching biasing block 48 is illustrated in FIG. 5A. In normal operation, $\overline{PU}$ (power up) is 0 so this block 48 is operational. The transistors P5 and N5 form a CMOS switch. When the signal Cbs=0 at terminal 60, the CMOS switch is open and the transistor N6 turns on. No current flow through the transistors N1–N3 and the lines 49, 50, and 51 into the frequency dividing cells 41, 42, and 43.

Figure 5B:
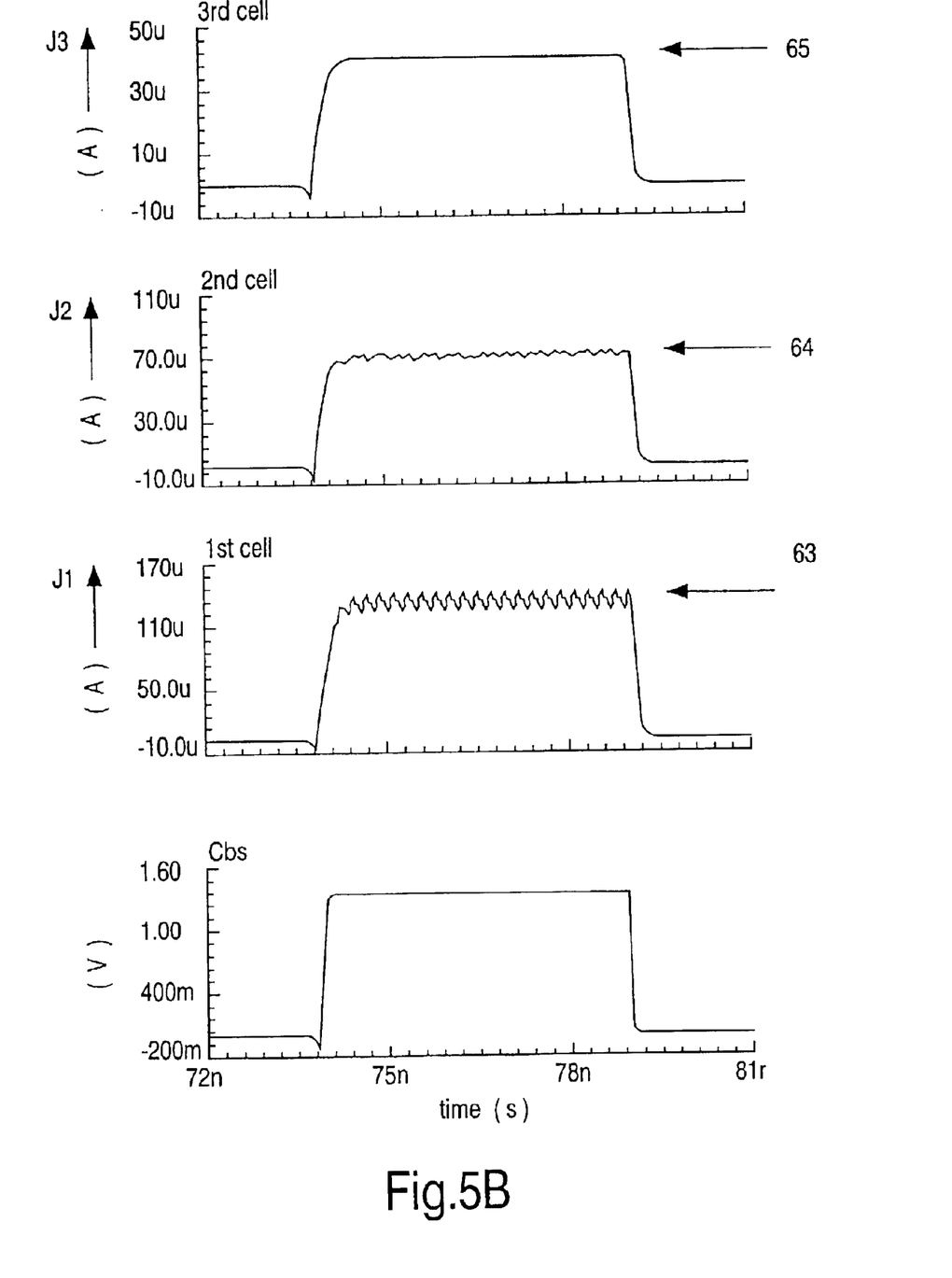
FIG. 5B is a diagram depicting the drain currents I1, I2, and I3, and the signal Cbs.

However, when the signal Cbs at the terminal 60 goes to 1, the CMOS switch is closed and the transistor N6 is off. As shown in FIG. 5B, the drain currents I1, I2, and I3 of the transistors N1–N3 quickly reach their final values 63, 64, and 65 because the voltage at node 62 is kept practically unchanged by the capacitor C.

FIG. 2B shows clearly that the prescaler logic block of all frequency dividing cells keeps dividing the input clock frequency (CK1–CK7) all the time (cf. left hand side of FIG. 2B) while the signals (MD1–MD6) from the end-of-cycle block change the states once a cycle 32. During the time of Cbs=0, there is no biasing current for the CML circuits of the end-of-cycle block in the first three frequency dividing cells 41–43. For this reason, the prescaler logic block in these frequency dividing cells 41–43 will not work properly if no special precaution is taken.

Figure 6A:
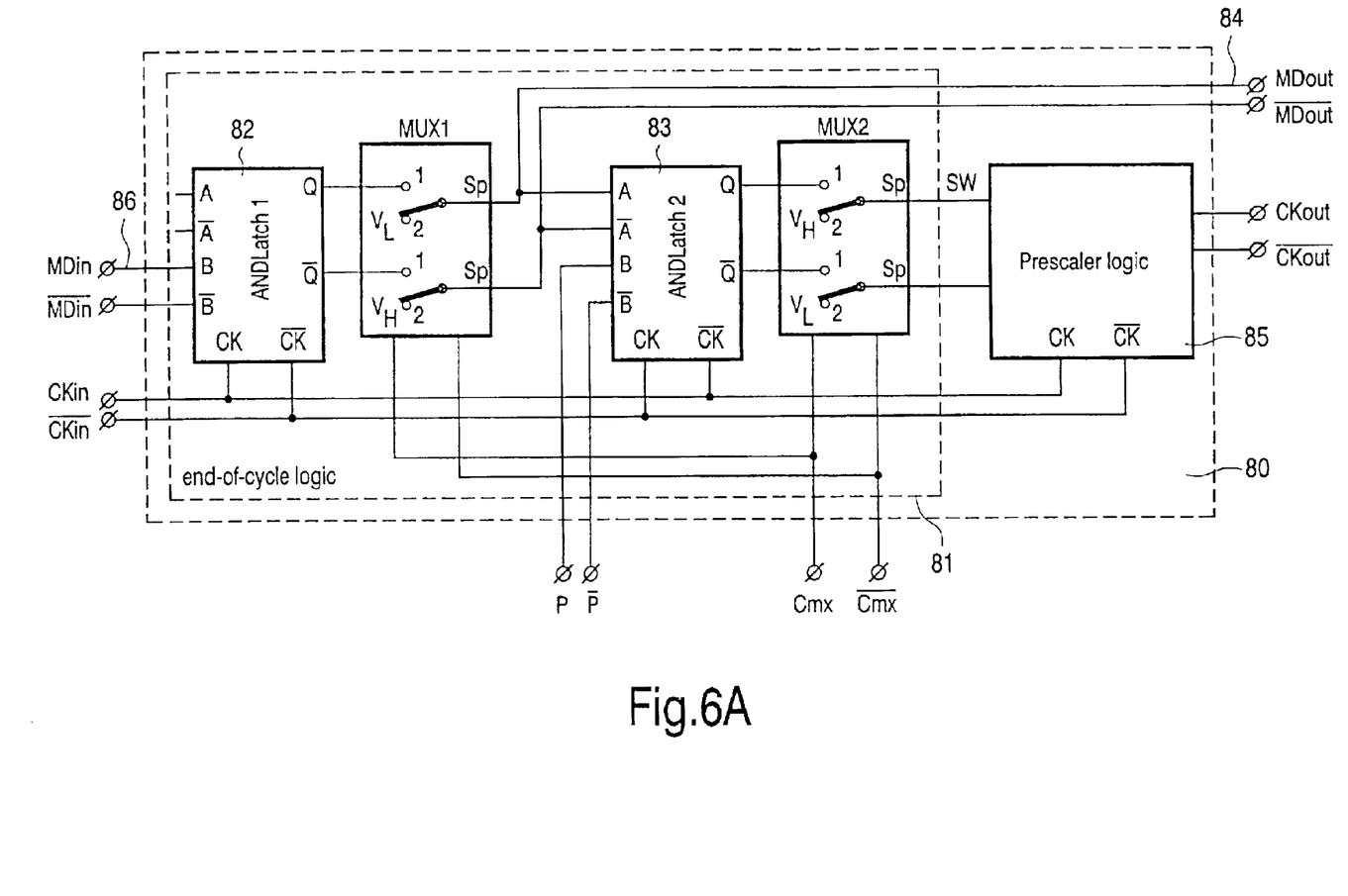
FIG. 6A is a schematic representation of a frequency dividing cell, in accordance with the present invention.

A new frequency dividing cell 80, according to the present invention, ensuring proper operation all the time is given in FIG. 6A.

It is seen from FIG. 2B that in a frequency dividing cell its mode control output (MDout) changes to logic 1 only after its mode control input (MDin) has become logic 1, and keeps logic 0 for almost all the time. The observation enables the development of the new frequency dividing cell 80 of FIG. 6A to guarantee correct functionality all the time. The biasing management has been discussed in detail before so for sake of simplicity it is not shown in the FIG. 6A. The end-of-cycle logic 81 contains two ANDLatches 82 and 83. The first ANDLatch 82 generates the mode control output (MDout) signal at terminal 84 for the frequency dividing cell 80, and the second ANDLatch 83 generates the swallow signal (SW). It is this signal SW that determines whether the prescaler logic block 85 swallows one additional pulse or not. Two multiplexers (MUX1 and MUX2) have been added, MUX1 after the ANDLatch 82 and MUX2 after the ANDLatch 83. When MDin=0 at terminal 86, the output Q of the ANDLatch 82 will also be 0, so MDout=0 as well. However, the Q output of ANDLatch 83 will be logic 1, meaning that no additional pulse will be swallowed. To ensure the correct operation during times where Cbs=0, the switch Sp and Sn in the MUX1 and MUX2 are switched to pole number 2. Well-defined DC voltages VL and VH are connected to the pole 2, as illustrated in FIG. 6A. Normally, these voltages VL and VH can be very easily provided by a current source and a resistor.

Figure 6B:
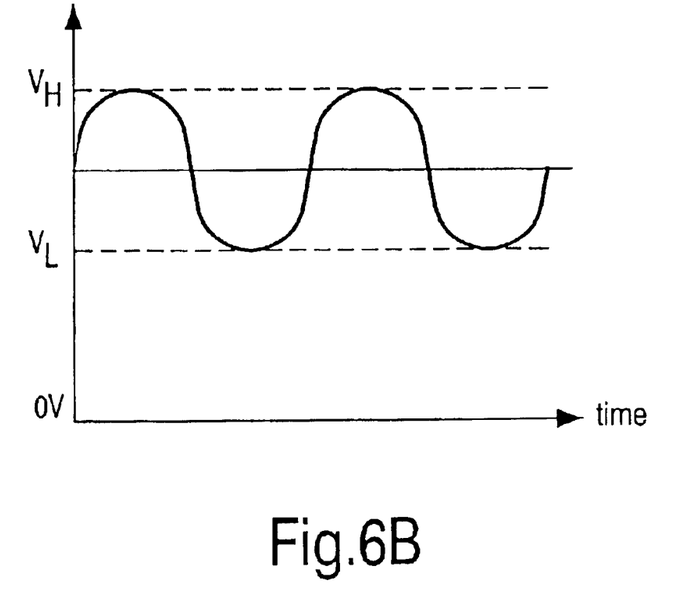
FIG. 6B is a diagram defining the voltages VH and VL.

In conventional frequency dividers all input signals (CKin) and output signals (MDout) have the same offset and amplitude, as depicted in FIG. 6B, where the definition of VH and VL is also shown. Note that VH=Vdd.

Before MDout is generated for the preceding cells in a chain of frequency dividing cells, Cbs goes to 1, thus turning on the biasing currents again. When Cmx is set to logic 1, the two switches in each of the multiplexers MUX1 and MUX2 switch to pole number 1. In this mode, the detailed connections of the frequency dividing cell shown in FIG. 3 is exactly the same as those in FIG. 2A, thus ensuring the same functionality.

Figure 6C:
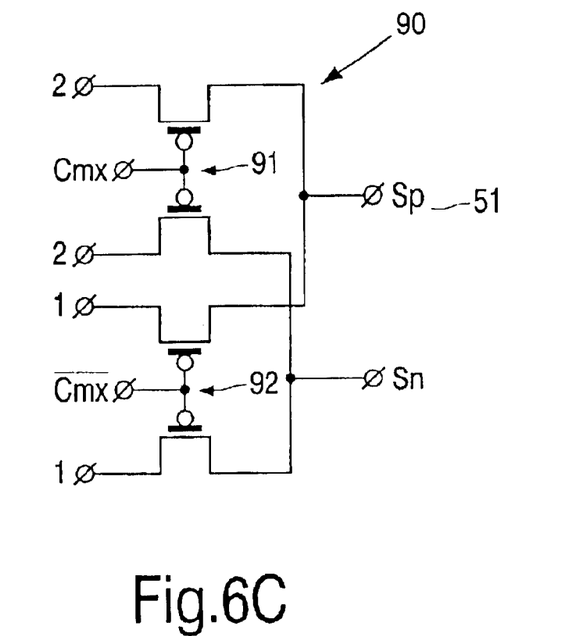
FIG. 6C is a schematic representation of a multiplexer, in accordance with the present invention, that can be employed in the frequency dividing cell of FIG. 6A.

An example of a suitable multiplexer 90 is illustrated in FIG. 6C. This multiplexer 90 can be used as MUX1 and/or as MUX2. The multiplexer 90 comprises two pMOS transistor pairs 91 and 92.

Based on the above, the end-of-cycle logic block in the first three frequency dividing cells 41–43 has basically two modes of operation, with the biasing currents on and off. The transition between these two modes has to be carefully managed to guarantee correct operation all the time. This is safeguarded by the timing of the Cbs and Cmx control signals. The timing and behavior of these signals is depicted in the diagram of FIG. 4B. The pulse width (PWx) of Cmx has to be roughly as wide as the pulse width of MD3 (PW3, cf. FIG. 2B) to cover MD2 and MD1 with some overlap, and the pulse width of Cbs (PWb) has to cover Cmx and $\overline{Cmx}$ with adequate overlap as well to take the switching delay and the tail current settling time into account.

Simulations can be used to confirm that the entire frequency dividing circuit 40 of FIG. 3 works well with the control signals shown in FIG. 4B.

Thanks to the switching nature of the tail currents in the new frequency dividing cells, its power consumption is much reduced. Assuming the same tail currents and the absence of buffers in each frequency dividing cell, and further neglecting the power overhead by the control block 47, the power saving or power reduction in percentage is in the range between 37.5% to 43.7%. The maximum power saving can approach 50% when the division ratio becomes very large.

In some divider circuits an ANDLatch entails higher tail current than a plain Latch. In this case the power saving can easily exceed 50%.

It must be pointed out that the proposed architecture can be applied to frequency divider with any number of cells without exception.

The present invention is well suited for use in transceivers. The invention is particularly well suited for use in one-chip CMOS transceivers.

A frequency divider in accordance with the present invention can be combined with other circuits in order to realize power efficient implementations of transceivers, radio frequency (RF) integrated circuits (ICs), GSM solutions, DECT devices, PCS, and Bluetooth solutions.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

What is claimed is:

1. Apparatus comprising a frequency dividing cell (42) with
   a prescaler logic;
   an end-of-cycle logic;
   a clock input for receiving an input clock (CKin) with frequency fn;

a clock output for providing an output clock (CKout) with frequency fm to a subsequent cell (43);

a mode control input for receiving a mode control input signal (MDin) from the subsequent cell (43); and a mode control output for providing a mode control output signal (MDout) to a preceding cell (41);

wherein the end-of-cycle logic has a switchable tail current source allowing the biasing current of the end-of-cycle logic to be switched off.

2. The apparatus of claim 1, comprising a chain (40) of frequency dividing cells (41–46).

3. The apparatus of claim 2, wherein a clock signal (CK1) to be divided is applicable to the clock input of one frequency dividing cell (41) of the chain the clock output (CK2) of the one frequency dividing cell (41) of the chain (40) is connected to the clock input of the subsequent frequency dividing cell (42) of the chain (40), the mode control input (MD1) of the one frequency dividing cell (41) of the chain (40) is connected to the mode control output of the subsequent frequency dividing cell (42) of the chain (40).

4. The apparatus of claim 3, wherein the clock signal (CK1) to be divided has a frequency fi being larger than the frequency fin at the clock output (CK2) of the one frequency dividing cell (41) of the chain (40).

5. The apparatus of claim 2, wherein several of frequency dividing cells of the chain of frequency dividing cells comprise a switchable tail current source, preferably those frequency dividing cells being located at the far front of the chain of frequency dividing cells.

6. The apparatus of claim 2, wherein each of the frequency dividing cells to be switched off comprises a switching biasing block allowing the biasing current of the end-of-cycle logic of the respective frequency dividing cell to be switched off, and wherein the apparatus further comprises a common control block.

7. The apparatus of claim 2, wherein each frequency dividing cell of the chain of cells comprises a programing input for application of a binary code word (P) allowing together with the mode control input signals (MDin) the division ratio fn/fm of the frequency dividing cells to be switched.

8. The apparatus of claim 1, wherein the frequency dividing cell is a divide-by-2/3 cell wherein the division ratio (fn/fm) is switchable between 2 and 3.

9. The apparatus of claim 1, wherein the prescaler logic and the end-of-cycle logic comprise latches being realized in current-mode logic (CML).

10. The apparatus of claim 9, wherein the latches of the prescaler logic and the end-of-cycle logic are triggered by the same input clock (CKin) being applied at the clock input.

11. The apparatus of claim 1, wherein the switchable tail current source is switched off for most of the time in a cycle.

12. The apparatus of claim 1, wherein the switchable tail current source is switched on when needed to generate a mode control output signal (MDout) for the preceding cell.

13. The apparatus of claim 1, wherein the switchable tail current source is switched on when needed to generate a swallow signal (SW) provided by the end-of-cycle logic to the prescaler logic.

14. The apparatus of claim 13, wherein the switchable tail current source is switched on when needed to generate the swallow signal.

15. The apparatus of claim 1, comprising means enabling the state of the mode control output signal and the state of the swallow signal to be maintained when the switchable tail current source is switched off.

16. The apparatus of claim 1, comprising a control block and a switching biasing block allowing the biasing current of the end-of-cycle logic for each of a plurality of frequency dividing cells to be switched off.

17. The apparatus of claim 16, wherein the control block generates a first control signal (Cbs) employed to control the biasing current in each of the dividing cells, a second control signal (Cmx), and a third control signal ($\overline{Cmx}$) being the inverted signal of the second control signal (Cmx).

18. The apparatus of claim 17, wherein the first control signal (Cbs), the second control signal (Cmx), and the third control signal ($\overline{Cmx}$) are rail-to-rail signals.

19. The apparatus of claim 16, wherein the switching biasing block comprises a multi-output current mirror delivering the biasing current for the end-of-cycle logic of the plurality of frequency dividing cells to be switched off.

20. The apparatus of claim 16, wherein the control block processes signals provided at different terminals within the chain of frequency dividing cells.

21. The apparatus of claim 1, wherein the frequency dividing cell to be switched comprise a flat multiplexer (MUX1) and a second multiplexer (MUX2).

22. The apparatus of claim 21, wherein the first multiplexer (MUX1) and the second multiplexer (MUX2) comprise pMOS transistors.

23. Transceiver comprising an apparatus according to claim 1.

24. Device with limited power resources comprising an apparatus according to claim 1.

25. Method for reducing the power consumption of an apparatus comprising a frequency dividing cell (80) with a prescaler logic;

an end-of-cycle logic with switchable tail current source allowing the biasing current of the end-of-cycle logic to be switched off;

a clock input for receiving an input clock (CKin) with frequency fn;

a clock output for providing an output clock (CKout) with frequency fm to a subsequent cell (43);

a mode control input for receiving a mode control input signal (MDin) from the subsequent cell (43); and a mode control output for providing a mode control output signal (MDout) to a preceding cell (41);

comprising the step:

switching the biasing current of the end-of-cycle logic off for a fraction of one cycle of the output of the apparatus.

26. The method of claim 25, whereby an on/off signal is generated by the frequency dividing cell, said on/off signal being used for switching the biasing current on and off.

* * * * *